US005308528A

United States Patent [19]

[11] Patent Number: 5,308,528

Desbiendras et al.

[45] Date of Patent: May 3, 1994

[54] CLEANING COMPOSITION BASED ON 1,1-DICHLORO-1-FLUOROETHANE AND METHYL FORMATE

[75] Inventors: Daniel Desbiendras, Villetaneuse; Jean-Jacques Martin, Bois-Colombes; Pascal Michaud, Saint-Gratien, both of France

[73] Assignee: Societe Atochem, France

[21] Appl. No.: 651,813

[22] Filed: Feb. 7, 1991

[30] Foreign Application Priority Data

Feb. 7, 1990 [FR] France ................................ 90 01395

[51] Int. Cl.[5] ......................... C11D 7/30; C11D 7/50; C23G 5/028; H05K 3/26

[52] U.S. Cl. ...................................... 252/171; 134/12; 134/31; 134/38; 134/40; 134/42; 252/153; 252/162; 252/170; 252/364; 252/DIG. 9

[58] Field of Search ............... 252/153, 162, 170, 171, 252/172, 364, DIG. 9; 134/12, 31, 38, 39, 40, 42; 203/67

[56] References Cited

U.S. PATENT DOCUMENTS

| | | | |
|---|---|---|---|
| 2,101,993 | 12/1932 | Fleischer | 62/178 |
| 3,914,191 | 10/1975 | Scott | 264/53 |
| 4,483,917 | 11/1984 | Archer et al. | 430/329 |
| 4,804,493 | 2/1989 | Gorski | 252/172 |
| 4,816,174 | 3/1989 | Lund et al. | 252/171 |
| 4,836,947 | 6/1989 | Lund et al. | 252/171 |
| 4,842,764 | 6/1989 | Lund et al. | 252/171 |
| 4,945,119 | 7/1990 | Smits et al. | 521/130 |
| 4,960,804 | 10/1990 | Doerge | 521/130 |
| 5,049,301 | 9/1991 | Logsdon et al. | 252/171 |
| 5,152,913 | 10/1992 | Desbiendras et al. | 252/171 |

FOREIGN PATENT DOCUMENTS

| | | |
|---|---|---|
| 116343 | 2/1984 | European Pat. Off. . |
| 325265 | 1/1989 | European Pat. Off. . |
| 1-132539 | 5/1989 | Japan . |
| 1-132814 | 5/1989 | Japan . |
| 1-139780 | 6/1989 | Japan . |
| WO9113966 | 9/1991 | World Int. Prop. O. . |

OTHER PUBLICATIONS

Derwent Abstract of PCT publication WO 9113966 Sep. 1991.

*Primary Examiner*—Linda Skaling

*Attorney, Agent, or Firm*—Morgan & Finnegan

[57] ABSTRACT

For replacing cleaning compositions based on 1,1,2-trichloro-1,2,2-trifluoroethane (F113), the invention provides a composition comprising 55 to 80% by weight of 1,1-dichloro-1-fluoroethane (F141b) and 45 to 20% by weight of methyl formate. These two compounds form a positive azeotrope (b.p. = 28.4° C. at atmospheric pressure).

The composition, which may be stabilized, can be used for cleaning solid surfaces, in particular for removing flux from printed circuits and for degreasing mechanical parts.

10 Claims, No Drawings

CLEANING COMPOSITION BASED ON 1,1-DICHLORO-1-FLUOROETHANE AND METHYL FORMATE

FIELD OF THE INVENTION

The present invention relates to the area of chlorofluorinated hydrocarbons and more particularly to a novel composition exhibiting an azeotrope which can be used as a cleaning and degreasing agent for solid surfaces, in particular for removing flux and low-temperature cleaning of printed circuits.

BACKGROUND OF THE INVENTION 1,1,2-Trichloro-1,2,2-trifluoroethane (known in the art under the name F113) is widely used in industry for cleaning and degreasing solid surfaces. Apart from its application in electronics for cleaning soldering fluxes to remove any flux still adhering to the printed circuits, its application in degreasing heavy metal parts and for cleaning high-quality, high-precision mechanical parts, such as, for example, gyroscopes and military or aerospace equipment may be mentioned. In its various applications, F113 is most often combined with other organic solvents (for example methanol), preferably in the form of azeotropic or pseudoazeotropic mixtures which do not separate and when being refluxed have essentially the same composition in the vapor phase as in the liquid phase.

However, F113 is one of the completely halogenated chlorofluorocarbons which are currently suspected of attacking and decomposing stratospheric ozone.

DESCRIPTION OF THE INVENTION

As a contribution to solving this problem, the present invention proposes to replace the compositions based on F113 by a novel composition based on methyl formate and 1,1,-dichloro-1-fluoroethane. The latter compound, known in the art under the name F141b, is virtually devoid of any destructive effect with respect to ozone.

The composition to be used according to the invention comprises 55 to 80% by weight of F141b and 20 to 45% of methyl formate.

This range gives rise to an azeotrope whose boiling temperature is 28.4° C. at standard atmospheric pressure (1.013 bar), while the composition according to the invention has pseudoazeotropic behavior, i.e., the composition of the vapor phase and liquid phase is essentially the same, which is particularly advantageous for the intended applications. Preferably, the F141b content is chosen from between 61 and 65% by weight and that of methyl formate from between 35 and 39% by weight.

The F141b methyl formate azeotrope is a positive azeotrope, since its boiling point (28.4° C.) is below that of the constituents (F141b:32° C.; methyl formate:31.7° C.).

Similarly to the known compositions based on F113, the composition according to the invention can be advantageously stabilized against hydrolysis and/or attack by free radicals, which are likely to occur during the cleaning process, by adding a conventional stabilizer, such as, for example, nitromethane, propylene oxide or a mixture of these compounds, the proportion of the stabilizer ranging from 0.01 to 5% relative to the total weight of F141b+methyl formate.

The composition according to the invention can be used for the same applications and using the same techniques as the former compositions based on F113.

EXAMPLES

The examples which follow illustrate the invention without limiting it.

EXAMPLE 1

DETECTION OF THE AZEOTROPE 100 g of methyl formate and 100 g of F141b are introduced in the bottom of a distillation column (30 plates). The mixture is then refluxed for one hour to bring the system to equilibrium. After reaching a steady temperature (28.4° C. ), a fraction (about 50 g) is removed and analyzed by gas-phase chromatography.

The test results shown in the table below indicate the presence of an F141b methyl formate azeotrope.

| | Composition (% by weight) | |
|---|---|---|
| | F141b | $HCOOCH_3$ |
| Initial mixture | 50 | 50 |
| Fraction removed | 63.5 | 36.5 |

EXAMPLE 2

VERIFICATION OF THE AZEOTROPIC COMPOSITION 200 g of a mixture comprising 64% by weight of F141b and 36% by weight of methyl formate are introduced into the boiler of an adiabatic distillation column (30 plates). The mixture is then refluxed for one hour to bring the system to equilibrium, and a fraction of about 50 g is then removed and it is then analyzed by gas-phase chromatography. The results listed in the table below show the presence of a positive azeotrope, since its boiling point is below that of the pure constituents: F141b and methyl formate.

| | Composition (% by weight) | |
|---|---|---|
| | F141b | $HCOOCH_3$ |
| Initial mixture | 64 | 36 |
| Fraction collected | 64 | 36 |
| Still bottom | 64.1 | 35.9 |

Boiling temperature corrected for 1.013 bar: 28.4° C.

When employed for cleaning soldering flux or degreasing mechanical parts, this azeotrope gives results which are as good as those of the compositions based on F113 and methanol.

EXAMPLE 3

COMPOSITION STABILIZED WITH NITROMETHANE 150 g of a mixture containing 64% by weight of F141b, 35.92% of methyl formate and 0.08% of nitromethane as stabilizer is introduced into an ultrasound cleaning bath. After the system has been refluxed for one hour, one aliquot of the vapor phase is removed. Its analysis by gas-phase chromatography shows the presence of nitromethane, which indicates that the mixture is stabilized in the vapor phase.

| | Composition (% by weight) | | |
|---|---|---|---|
| | F141b | $HCOOCH_3$ | $CH_3NO_2$ |
| Initial mixture | 64 | 35.92 | 0.08 |
| Vapor phase | 64 | 35.98 | 0.02 |

EXAMPLE 4 COMPOSITION STABILIZED WITH PROPYLENE OXIDE

Example 3 is repeated, replacing the nitromethane by propylene oxide, to give the following results.

| | Composition (% by weight) | | |
|---|---|---|---|
| | F141b | $HCOOCH_3$ | $C_3H_6O$ |
| Initial mixture | 63.7 | 36.2 | 0.1 |
| Vapor phase | 63.82 | 36.1 | 0.08 |

EXAMPLE 5

BISTABILIZED COMPOSITION

Example 3 is repeated, using 0.1% of nitromethane and 0.1% of propylene oxide, to give the following results:

| | F141b | $HCOOCH_3$ | $CH_3NO_2$ | $C_3H_6O$ |
|---|---|---|---|---|
| Initial mixture | 63.5 | 36.3 | 0.1 | 0.1 |
| Vapor phase | 63.9 | 36 | 0.02 | 0.08 |

EXAMPLE 6

CLEANING-OFF SOLDERING FLUX 200 g of the azeotropic F141b methyl formate composition are introduced into an Annemasse ultrasonic bath, and the mixture is then brought to the boiling temperature.

Glass plates which are coated with soldering flux and have been heated in an oven at 220° C. for 30 seconds are immersed in the boiling ultrasonic liquid for 3 minutes and then rinsed in the vapor phase for 3 minutes.

After drying in air, inspection using low-angle illumination reveals a complete absence of any residual soldering flux. Thus, the same result was obtained as when using an F113/methanol (93.7%/6.3%) composition.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

We claim:

1. Azeotropic cleaning composition consisting of 55 to 80% by weight of 1,1-dichloro-1-fluoroethane and 45 to 20% by weight of methyl formate in combination with 0 to 5% by weight of at least one stabilizer relative to the total weight of the mixture of 1,1-dichloro-1-fluoroethane and methyl formate, said composition having pseudoazeotropic behavior in that when being refluxed the composition is essentially the same in the vapor phase as in the liquid phase, said composition further forming an azeotrope whose boiling temperature is about 28.4° C. At atmospheric pressure.

2. Composition according to claim 1, wherein 0.01 to 5% of at least one stabilizer is present.

3. Composition according to claim 2, wherein the stabilizer is nitromethane, propylene oxide or a mixture of these compounds.

4. Azeotropic cleaning composition consisting of 55 to 80% by weight of 1,1-dichloro-1-fluoroethane and 45 to 20% by weight of methyl formate, said composition having pseudoazeotropic behavior in that when being refluxed the composition is essentially the same in the vapor phase as in the liquid phase, said composition further forming an azeotrope whose boiling temperature is about 28.4° C. at atmospheric pressure.

5. Composition according to claim 4, consisting of 61 to 65% by weight of 1,1-dichloro-1-fluoroethane and 39 to 35% by weight of methyl formate.

6. An azeotrope composition consisting of about 55 to 65 percent by weight 1,1-dichloro-1-fluoroethane and about 35 to 45 percent by weight methyl formate wherein the composition boils at about 28.4° C. at atmospheric pressure.

7. An azeotrope composition consisting of about 61 to 65 percent by weight 1,1-dichloro-1-fluoroethane and about 35 to 39 percent by weight methyl formate wherein the composition boils at about 28° C. at atmospheric pressure.

8. An azeotrope composition consisting of about 64 percent by weight 1,1-dichloro-1-fluoroethane and about 36 percent by weight methyl formate wherein the composition boils at about 28.4° C. at atmospheric pressure.

9. Method of using a composition for cleaning solid surfaces which comprises:

applying to a solid surface to be cleaned and degreased a cleaning composition consisting of 55 to 80% by weight of 1,1-dichloro-1-fluoroethane and 45 to 20% by weight of methyl formate, said composition having pseudoazeotropic behavior in that when being refluxed, the composition is essentially the same in the vapor phase as in the liquid phase, said composition further forming an azeotrope whose boiling temperature is about 28.4° C. at atmospheric pressure.

10. Method according to claim 9 for removing flux from printed circuits and degreasing mechanical parts.

* * * * *